(12) United States Patent
Dueck

(10) Patent No.: US 9,147,990 B2
(45) Date of Patent: Sep. 29, 2015

(54) TWO-DIMENSIONAL LASER SYSTEM EMPLOYING TWO DISPERSIVE ELEMENTS

(71) Applicant: Robert H. Dueck, Santa Ana, CA (US)

(72) Inventor: Robert H. Dueck, Santa Ana, CA (US)

( * ) Notice: Subject to any disclaimer, the term of this patent is extended or adjusted under 35 U.S.C. 154(b) by 89 days.

(21) Appl. No.: 13/762,166

(22) Filed: Feb. 7, 2013

(65) Prior Publication Data

US 2013/0201560 A1 Aug. 8, 2013

Related U.S. Application Data

(60) Provisional application No. 61/595,838, filed on Feb. 7, 2012.

(51) Int. Cl.
| | |
|---|---|
| *G02B 27/10* | (2006.01) |
| *H01S 3/00* | (2006.01) |
| *H01S 5/40* | (2006.01) |
| *G02B 27/09* | (2006.01) |
| *H01S 5/00* | (2006.01) |
| *H01S 5/14* | (2006.01) |

(52) U.S. Cl.
CPC ............ *H01S 3/0071* (2013.01); *G02B 27/095* (2013.01); *G02B 27/10* (2013.01); *G02B 27/1006* (2013.01); *H01S 5/4012* (2013.01); *H01S 5/4062* (2013.01); *H01S 5/4087* (2013.01); *H01S 5/005* (2013.01); *H01S 5/141* (2013.01)

(58) Field of Classification Search
CPC ..... H01S 5/005; H01S 5/4012; H01S 5/4025; H01S 5/4075; H01S 5/4087; H01S 3/0085; H01S 3/08004; H01S 3/08009; H01S 3/10; G02B 27/0977; G02B 6/4214; G02B 6/2938; G02B 6/29311; G02B 6/29394; G02B 27/0944; G02B 27/1006; G02B 27/0905; G02B 27/44; G02B 19/0028

USPC ................... 359/558–869, 349, 556; 372/50.11–50.122, 99, 100, 102; 362/231, 241

See application file for complete search history.

(56) References Cited

U.S. PATENT DOCUMENTS

| | | | | |
|---|---|---|---|---|
| 5,263,039 | A * | 11/1993 | Skupsky et al. ................. | 372/25 |
| 6,434,291 | B1 * | 8/2002 | Kessler et al. .................. | 385/24 |
| 2006/0291773 | A1 * | 12/2006 | Wu et al. .......................... | 385/18 |
| 2009/0231580 | A1 * | 9/2009 | Nagy et al. ..................... | 356/326 |
| 2010/0296091 | A1 * | 11/2010 | Wein et al. ..................... | 356/334 |
| 2011/0222574 | A1 | 9/2011 | Chann et al. | |
| 2014/0240977 | A1 * | 8/2014 | Hu et al. ........................ | 362/231 |

* cited by examiner

*Primary Examiner* — Zachary Wilkes
*Assistant Examiner* — Collin X Beatty
(74) *Attorney, Agent, or Firm* — Kenneth L. Green; Averill & Green

(57) ABSTRACT

An apparatus and method for two-dimensional wavelength beam combining of a plurality of laser sources. In one embodiment, an external cavity multi-wavelength laser comprises an array of laser gain elements, two optical transform lenses, two dispersive elements, an imaging system, a deflective array, and an output coupler. First and second optical transform lenses spatially overlap optical beams in first and second dimensions forming regions of overlap at the first and second dispersive elements. The deflective array comprises a plurality of mirrors wherein each mirror deflects and rearranges the optical beams from a common row. The dispersive elements introduce wavelength discrimination that when combined with the output coupler, provide the required feedback gain. The output coupler creates a single output port for the plurality of external optical cavities established in unison with the plurality of laser emitters. The output coupler transmits a multi-wavelength output beam comprising spatially overlapped coaxial optical beams.

28 Claims, 7 Drawing Sheets

TWO-DIMENSIONAL LASER SYSTEM EMPLOYING TWO DISPERSIVE ELEMENTS

CROSS-REFERENCE TO RELATED APPLICATIONS

The present application claims the priority of U.S. Patent Application Ser. No. 61/595,838 filed Feb. 7, 2012, which application is incorporated in its entirety herein by reference.

BACKGROUND OF THE INVENTION

The present invention relates generally to the field of lasers and in particular to methods and apparatus for configuring two-dimensional multi-wavelength laser source arrays into composite coaxial beams having higher laser power.

Laser systems that use multiple laser sources or multiple laser gain medium, are utilized in a variety of applications including cutting, machining, welding, material processing, laser pumping, fiber optic communications, free-space communications, illumination, imaging and numerous medical procedures. Many of these applications can be significantly benefitted with higher laser power. In support of achieving higher laser power, the input energy is typically increased. However, simply increasing the input energy may introduce additional thermal management considerations. For example, thermal conditions and heat load within the laser gain medium typically contribute to internal aberrations and corresponding beam quality reductions in the emitted radiation. Additionally, unaddressed internal heating may also lead to internal damage of the laser components themselves. In general, issues like these place practical limits on the achievable laser power for a given laser system design approach. In many cases the most cost effective method for further power scaling is achieved by combining the optical outputs from more than one laser or laser gain medium.

The ability to focus a laser beam into a small spot is generally characterized by its beam quality which is in part, a measure of its usefulness in a many applications. Ideally, laser power scaling through beam combining of multiple laser sources or multiple laser gain medium would be done in a manner that minimizes the reduction in the beam quality of the combined beam. When considered in combination, both laser power and laser beam quality contribute to what is typically termed beam brightness. When either or both laser beam power and laser beam quality are improved, the brightness of the laser beam is said to be improved. Beam brightness, being a measure of the combination of the power and focusability of a laser beam, is a fundamental measure of a laser beam's overall utility in many high power applications.

Historically, many methods have been used to advance the above objectives with varying degrees of success. These methods can be organized into three broad categories of design approaches, namely coherent, incoherent and polarization approaches. Methods characterized by coherent approaches have the ability to power scale significantly but require a high degree of mutual coherence between the laser sources. They generally employ real time beam phasing techniques between the laser sources or laser gain medium that are complex and costly to implement. Polarization approaches are simple to implement but, by themselves, do not scale beyond a factor of two, one for each available polarization. There are many approaches that do not use either mutual coherence or polarization to combine beams. These fall within the category of incoherent approaches. In general, incoherent approaches are easier to implement then coherent approaches.

One of the simplest incoherent approaches employs side-by-side beam combining whereby the laser sources or laser gain medium are arranged side-by-side, propagate nominally parallel to one another, are not overlapping or coaxial, and are not phased to each other. This incoherent side-by-side combined beam can be focused but does not produce an optimal focused spot for the given diameter of the side-by-side combined beam. In this case, the beam quality is said to be reduced. Incoherent approaches that both power scale and also maintain good beam quality generally employ specified and unique wavelengths for each laser source or laser gain medium as a fundamental aspect in the combining process. This technique is often called wavelength or spectral beam combining. Examples of components often employed in these systems are dispersive prisms, dialectic wavelength filters, volume Bragg gratings, and diffraction gratings. Naturally, this approach leads to combined beams having many wavelengths, or put another way, a large laser linewidth. In some laser applications, having a large laser linewidth may not be a desirable feature, but for many other laser applications, a large laser linewidth may be inconsequential and may even be advantageous in still other laser applications.

Within the prior art, two dispersive methods of wavelength beam combining employing angular dispersion have been disclosed that achieve the challenging task of combining two-dimensional laser emitter arrays while maintaining beam quality. In both of these dispersive methods, a plurality of wavelength dependent dispersive elements are used sequentially in two essentially orthogonal directions to combine the two-dimensional array of beams into a single composite beam. In the first method, the orthogonal dispersive elements include a first-order diffraction grating or prism and an Echelle diffraction grating operating in several high diffracting orders simultaneously. In a second method, the orthogonal dispersive elements include a first-order diffraction grating or prism and a first-order diffraction grating stack made up of a plurality of individual first-order diffraction gratings each having a different amount of angular dispersion. An example of a two-dimensional wavelength beam combining system that includes the use of high-order Echelle gratings is disclosed in U.S. Pat. No. 6,327,292 to Sanchez-Rubio et al. filed on Jun. 21, 1999. Two different examples of two-dimensional wavelength beam combining systems employing the use of a first-order diffraction grating stack are disclosed in U.S. Pat. No. 8,179,594 to Tidwell et al. filed on Jun. 30, 2008 and U.S. Patent Application No. US 2011/0222574 A1 to Chann et al. filed on Mar. 9, 2010.

BRIEF SUMMARY OF THE INVENTION

The present invention addresses the above and other needs by providing a method and apparatus for two-dimensional wavelength beam combining of laser sources or laser gain medium in which a first-order diffraction grating and a deflective array of mirrors are used instead of a first-order diffraction grating stack or an Echelle diffraction grating used in multiple are used for generating high-power, high-brightness, multi-wavelength laser systems and laser beams using two-dimensional arrays of laser emitters by wavelength beam combining.

In accordance with one aspect of the invention, since the system can be constructed using a significantly reduced number of diffraction gratings and without need for a first-order diffraction grating stack, embodiments of the present invention may be simpler to implement and may make use of less costly off-the-shelf diffraction gratings. In addition, since the system can be constructed without higher-order Echelle diffraction gratings, embodiments of the system may have high wavelength beam combining efficiency.

In accordance with another aspect of the invention, there is provided a multi-wavelength laser system comprising a plurality of laser emitters. In another embodiment, a laser emitter is comprised of a laser source producing optical radiation and having a wavelength and having a linewidth and having an optical axis. In another embodiment, a laser emitter is comprised of a laser gain medium capable of amplifying optical radiation at a specified wavelength and over a specified linewidth and having an optical axis. In another embodiment, a laser emitter has a fast-axis collimating optical arrangement. In another embodiment, a laser emitter has a slow-axis collimating optical arrangement. In yet another embodiment, a laser emitter has both a fast-axis and a slow-axis collimating optical arrangement.

In accordance with yet another aspect of the invention, there is provided a multi-wavelength laser comprising an array of laser emitters arranged in a two-dimensional pattern, a first dispersive element producing wavelength dependent angular dispersion in a first dimension, a deflective array comprising a plurality of mirrors or optical wedges and arranged in a second dimension and producing deflection in a first dimension, and a second dispersive element producing dispersion in a second dimension. The multi-wavelength laser further includes second dimension imaging optics positioned between the deflective array and the array of laser emitters and configured to reimage in at least one dimension a scaled image of the optical field near the laser emitter array to a location near a deflective array. The multi-wavelength laser further includes a first optical transform lens and a second optical transform lens. The first optical transform lens produces focus power in a first dimension and positioned approximately a focal length from the array of laser emitters and configured to spatially overlap the optical beams in a first dimension forming a first region of overlap at the first dispersive element. The second optical transform lens produces focus power in a second dimension and positioned between the second dispersive element and the first dispersive element and configured to receive the optical beams from the first dispersive element and to spatially overlap the optical beams in the second dimension forming a second region of overlap at the second dispersive element. The second dispersive element transmits a multi-wavelength output beam comprising the spatially overlapped and coaxial optical beams from the array of laser emitters.

In one example, the dispersive element is a first-order diffraction grating. In another example, the dispersive element is a prism. In one example, the deflective array is a set of mirrors, each having specified angles and positions. In another example, the deflective array is a set of optically transparent wedges, each having specified angles and positions. In one example, the first dimension is perpendicular to the second dimension. In another example, the imaging optics comprise a first lens element and a second lens element. In another example, the imaging optics comprise a first, a second and a third lens element. In another example a first optical transform lens is positioned between the first lens element and the second lens element. In another example a first optical transform lens is positioned between the array of laser emitters and the first lens element. In another example a first optical transform lens is positioned between the second lens element and the deflective array. In another example, the array of laser emitters comprises a plurality of laser emitters arranged in first number of rows, and deflective array in first number of mirrors. In another example, each deflective array mirror is constructed and arranged to deflect a group of laser emitter beams from a common row of emitters comprising first dimension spatially overlapped optical beams. In another example, each deflective array mirror is constructed and arranged to deflect a group of laser emitter beams from a common row of emitters comprising first dimension non-spatially overlapped optical beams. In another example, the deflective array is positioned between the first dispersive element and the second optical transform lens. In another example, the deflective array is positioned between the second lens element of the imaging optics and the first dispersive element.

In another example, the laser emitters are laser gain media and an output coupler and is positioned after the second dispersive element wherein the output coupler reflects a fraction of the optical radiation form a plurality of beams and transmits a multi-wavelength output beam comprising the spatially overlapped and coaxial optical beams from the array of laser emitters. In another example, the laser emitters are laser sources each having a specified wavelength and linewidth.

Another embodiment is directed to a method of two-dimensional wavelength beam combining in a laser system. The method includes acts of spatially overlapping in a first dimension, optical beams from a plurality of laser emitters using a first dispersive element and a deflective array comprising a plurality of mirrors or transparent optical wedges, reproducing in at least one dimension a scaled image of the optical field near the laser emitter array to a location near a deflective array, and spatially overlapping in a second dimension the optical beams from the first dispersive element at the second dispersive element to generate a multi-wavelength output beam.

In one example of the method, reproducing in at least one dimension a scaled image of the optical field near the laser emitter array to a location near a deflective array includes acts of imaging the optical beams with second dimension imaging optics positioned between the deflective array and the plurality of laser emitters. In another example, spatially overlapping in the first dimension the optical beams from the plurality of laser emitters includes spatially overlapping the optical beams in the first dimension using a first optical transform lens to form a first region of overlap at the first dispersive element. The method may further comprise an act of transmitting the multi-wavelength output beam from a second dispersive element. In one example, spatially overlapping in the second dimension the optical beams from the first dispersive element includes spatially overlapping the optical beams in the second dimension using a second optical transform lens to form a second region of overlap at the second dispersive element.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE SEVERAL VIEWS OF THE DRAWING

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

Corresponding reference characters indicate corresponding components throughout the several views of the drawings.

DETAILED DESCRIPTION OF THE INVENTION

Figure 1:
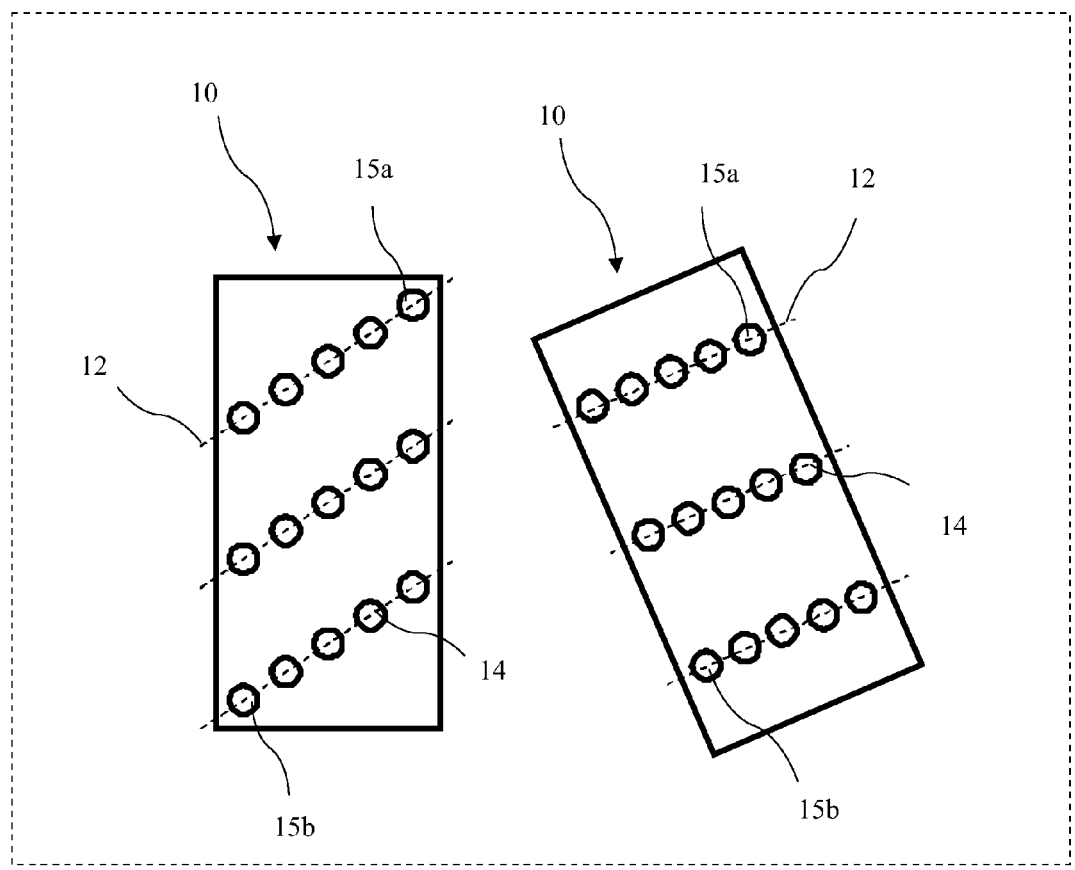
FIG. 1 is a schematic diagram of two examples of two-dimensional laser emitter array according to aspects of the present invention.

The following description is of the best mode presently contemplated for carrying out the invention. This description is not to be taken in a limiting sense, but is made merely for the purpose of describing one or more preferred embodiments of the invention. The scope of the invention should be determined with reference to the claims.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Furthermore, although the following discussion may refer primarily to lasers as an example, the aspects and embodiments discussed herein are applicable to any type of electro magnetic source that is wavelength-selectable, including, but not limited to, semiconductor lasers, diode lasers and fiber lasers, laser amplifier, and master oscillator power amplifier systems.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, first dimension and second dimension, and vertical and horizontal are intended for convenience of description, not to limit the present systems and methods or their components to any one positional or spatial orientation.

The present invention is directed to a two-dimensional wavelength beam combining implementation including two-dimensional laser sources, two dispersive elements, and a deflective array as a technique to enhance power and brightness. As discussed above, prior art two-dimensional wavelength beam combining systems rely on first and second dimension dispersive elements. The prior art teaches the use of a first-order diffraction grating or prism as the angle and wavelength dependent dispersive element in a second dimension, and either an Echelle diffraction grating operating in high diffracting orders or a first-order diffraction grating stack, as the angle and wavelength dependent dispersive element in a first dimension.

By contrast to prior art, one embodiment of the present invention also includes the use of two-dimensional dispersive elements but is distinguished from prior art by its use of a first-order diffraction grating or prism as the angle and wavelength dependent dispersive element in both the first and second dimension and the use of a deflective array of mirrors or optically transmitting wedges, as discussed further below. When compared to prior art teachings instructing the use of Echelle diffraction gratings operating in high order diffraction orders, which generally have low diffraction efficiency, the present invention, which can employ all first-order diffraction gratings and which may have significantly higher diffraction efficiency, may have a higher beam combining efficiency than embodiments employing prior art. Furthermore, since the total number of dispersive elements employed in the present invention is reduced to two, the present invention may be simpler to implement than prior art employing a diffraction grating stack. Additionally, since the present invention does not employ the prior art teaching of a diffraction grating stack made up of an array of diffraction gratings having either different period or different angle, the present invention may potentially make use of less expensive off-the-shelf diffraction gratings.

FIG. 1 shows examples of two examples of embodiments of two-dimensional laser emitter arrays 10 comprising a plurality of laser emitters 14 (e.g., laser source or laser gain medium) arranged in rows as laser emitter rows 12. The emitters 14 may be any type of source of electromagnetic radiation whereby the wavelength and linewidth can be specified. Electromagnetic radiation emerging from laser emitter 14 may be generated from a device or system not shown. Each laser emitter 14 may be a laser source that emits optical radiation at a predetermined wavelength, and may be self wavelength-stabilized using an internal grating, external volume Bragg grating, an amplifier seed from a master oscillator or by some other self wavelength-stabilizing method.

The laser emitters 14 may be a laser gain medium whereby electromagnetic amplification of optical radiation may take place at a specified wavelength and over a specified linewidth. Each laser emitter row 12 is comprised of two or more laser emitters 14 and collectively form a row group. The laser emitters 14 within a laser emitter row 12 are positioned in a nominally linear fashion and may be positioned on equal or unequal center-to-center spacing in either a first or second or combination of first and second dimensions. It is to be appreciated that the laser emitters 14 in a laser emitter row 12 may or may not be on a straight line, depending on the specifics of other components used by an embodiment. It is also to be appreciated that laser emitter rows 12 may or may not be on parallel lines, depending on the specifics of other components in used by an embodiment.

The laser emitters 14 may include, for example, a plurality of discrete single-mode or multi-mode semiconductor amplifiers or a plurality of fiber amplifiers, and may preferably have sufficient gain and sufficient gain bandwidth to overcome optical losses at the desired lasing wavelengths. Furthermore, a plurality of the laser emitters 14 in the two-dimensional wavelength beam combining laser emitter array 10 has a linewidth which can be defined as Full Width Half Max (FWHM) of the laser emitter's wavelength. The wavelength and linewidth of a laser emitter 14 are specified such that the range of wavelengths within each laser emitter 14 are not produced by more than one of the laser emitters 14. As a result, embodiments of the present invention employ these wavelength differences as a means to direct each beam from each laser emitter 14 through the optics of an embodiment in a unique way that is dependent on its wavelength and linewidth.

In one example, the wavelengths of the laser emitters 14 within each laser emitter row 12 of the laser emitter array 10 are monotonically changing in a nearly linear manner from laser emitter 14 to laser emitter 14 across laser emitter rows 12, and continuing from laser emitter row 12 to laser emitter row 12 in a raster scan manner across all of the laser emitters 14 with the longest and shortest wavelengths associated with two corner laser emitter 14 at opposite laser emitter end one 15a and at opposite laser emitter end two 15b of the laser emitter array 10.

Figure 2:
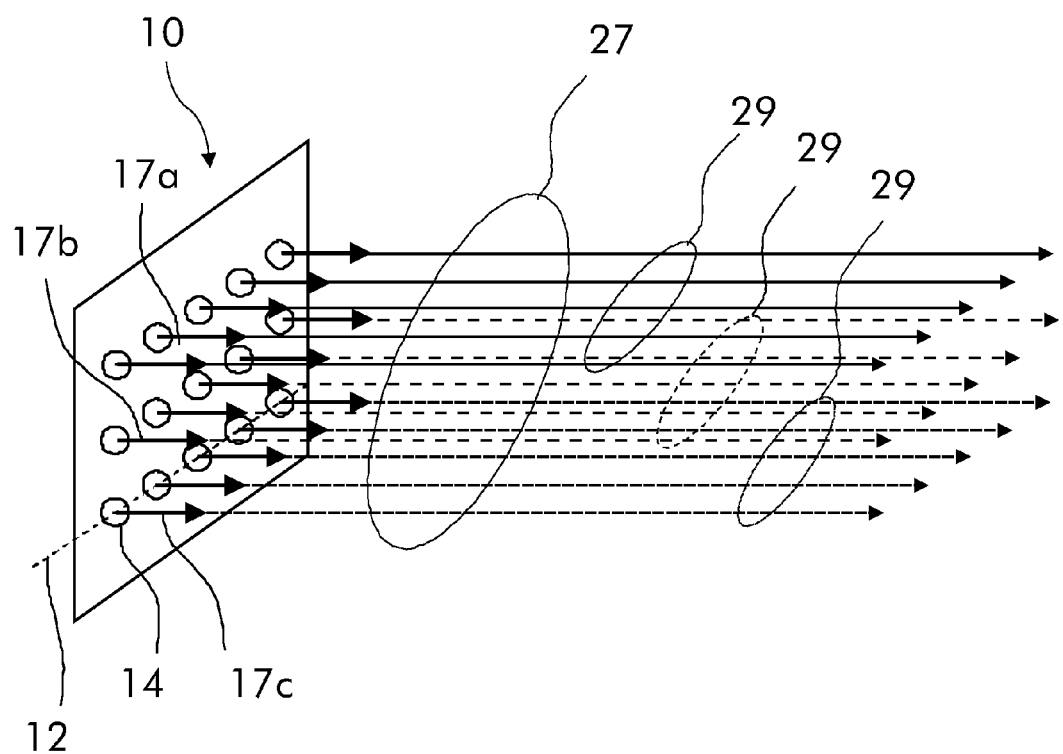
FIG. 2 is a schematic diagram of one example of a laser emitter array according to aspects of the present invention.

Illustrated in FIG. 2 is a laser emitter array 10 and shows a multi-wavelength beam 27 comprising the optical beams generated by the laser emitters 14 within the laser emitter array 10, according to aspects of the present invention. A multi-wavelength row beam 29 comprises the optical beams generated by the laser emitters 14 within a common laser emitter row 12, according to aspects of the present invention.

Figure 3:
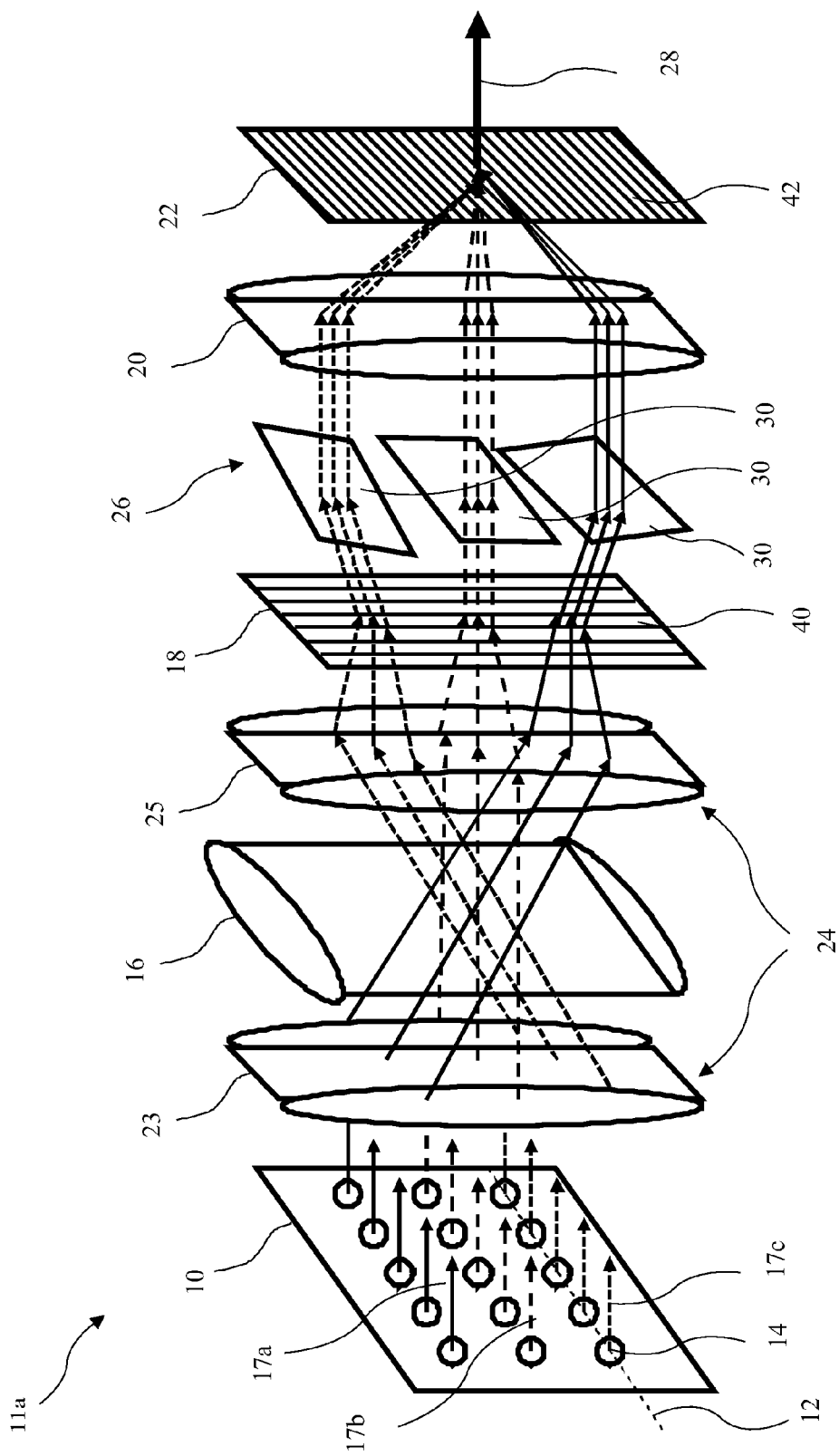
FIG. 3 is a schematic diagram of one example of a two-dimensional laser system in a laser emitter source configuration according to aspects of the invention.

A first embodiment of a two-dimensional multi-wavelength beam combining system in a laser emitter source configuration 11a is shown in FIG. 3. The system 11a includes the laser emitter array 10. The laser emitter array 10 may be comprised of a plurality of laser emitters 14 and may be arranged in rows as laser emitter rows 12. Each laser emitter 14 may emit a beam of optical radiation at a unique wavelength and over a specified linewidth as discussed above. In the laser emitter source configuration 11a, and each laser emitter 14 emits at a predetermined wavelength. The center of each beam emitted from each laser emitter 14 travels along an optical path that defines an optical axis. In the example shown in FIG. 3, an optical axis for a laser emitter 14 within a first laser emitter row 12 is shown as a solid line optical axis 17a. Optical axes for laser emitters 14 within subsequent laser emitter rows 12 are shown as long and short dashed line optical axis 17b and 17c, respectively. As shown in the example illustration of FIG. 3, the laser emitter array 10 may be used as the input beam to a two-dimensional wavelength beam combining system.

In the example of the present invention illustrated in FIG. 3, two dispersive elements 18, 22 are shown as first first-order diffraction grating 18, and second first-order diffraction grating 22. The first and second first-order diffraction gratings 18 and 22 are shown with first and second parallel diffraction grating lines 40, 42, respectively, and are arranged in two orthogonal first and second dimensions, respectively. For ease of explanation, the first dispersive element 18 is said to have second dimension (depicted as vertical) diffraction grating lines 40 and having first dimension (depicted as horizontal) dispersive effects, and the second dispersive element 22 is said to have first dimension (depicted as horizontal) diffraction grating lines 42 and having second dimension (depicted as vertical) dispersive effects. The first or second dispersive element 18, 22 may comprise a reflection diffraction grating or comprise a transmission diffraction grating or may comprise an optical prism or may comprise any other device having angular dispersion that is dependent on the wavelength of the beam impinging the dispersive element 18, 22. For ease of illustration in FIG. 3, only the beams of interest are shown emerging from first and second dispersive elements 18, 22. Other beams may or may not emerge from the dispersive elements 18, 22 in additional diffraction orders and would not contribute to the energy of the combined beam and would contribute to an energy loss and reduced system efficiency.

The system 11a may further include imaging optics 24. In this example, the imaging optics 24 are comprised of a first lens element 23, and a second lens element 25 that form an optical imaging telescope and placed somewhere between the laser emitter array 10 and the deflective array 26. In this example the first and second lens elements 23, 25 are comprised of cylindrical optics with optical power in the second dimension as shown. Other examples of imaging optics 24 can be comprised of one, two, three or more optical lenses, and have optical power in either or both the first or second dimension. In this example the imaging optics 24 image in the second dimension an object plane at or near the laser emitter array 10 onto an image plane at or near a deflective array 26. The deflective array 26 is comprised of an array of deflective elements 31. Furthermore, in the imaging process of this example, the imaging optics 24 are configured to reimage in the second dimension a scaled image of the optical field (both intensity and phase) near the laser emitter array 10 to a location near the deflective array 26. In this example, the imaging optics 24 have little impact on the beam propagation properties of the two-dimensional multi-wavelength beams in the first dimension. Also in this example, the imaging optics 24 image between object plane and image plane with magnification $m_Y$ in the second dimension and also reproduce at the image plane, the propagation angles in the second dimension of each beam at the object plan with magnification $1/m_Y$.

In this embodiment of the system 11a is comprised a first optical transform lens 16. In this example, a first optical transform lens 16 employs optical power in a first dimension with focal length $f_1$ and is placed between a laser emitter array 10 and a first dispersive element 18, and is used to spatially overlap beams in a first dimension at a first dispersive element 18. The distance between a first dispersive element 18 and a first optical transform lens 16 is nominally equal to the focal length of a first optical transform lens 16. The distance between a laser emitter array 10 and a first transform lens 16 is nominally equal to the focal length of a first optical transform lens 16.

The system 11a may further include a second optical transform lens 20. In this example, a second optical transform lens 20 employs optical power in a second dimension with focal length $f_2$ and is placed between the first dispersive element 18 and the second dispersive element 22, and is used to spatially overlap beams in a second dimension at the second dispersive element 22. The separation of the first dispersive element 18 and the second optical transform lens 20 is preferably equal to the focal length of a second optical transform lens 20. The separation of the second optical transform lens 20 and the second dispersive element 22 is also preferably equal to the focal length of a second optical transform lens 20.

Figure 4:
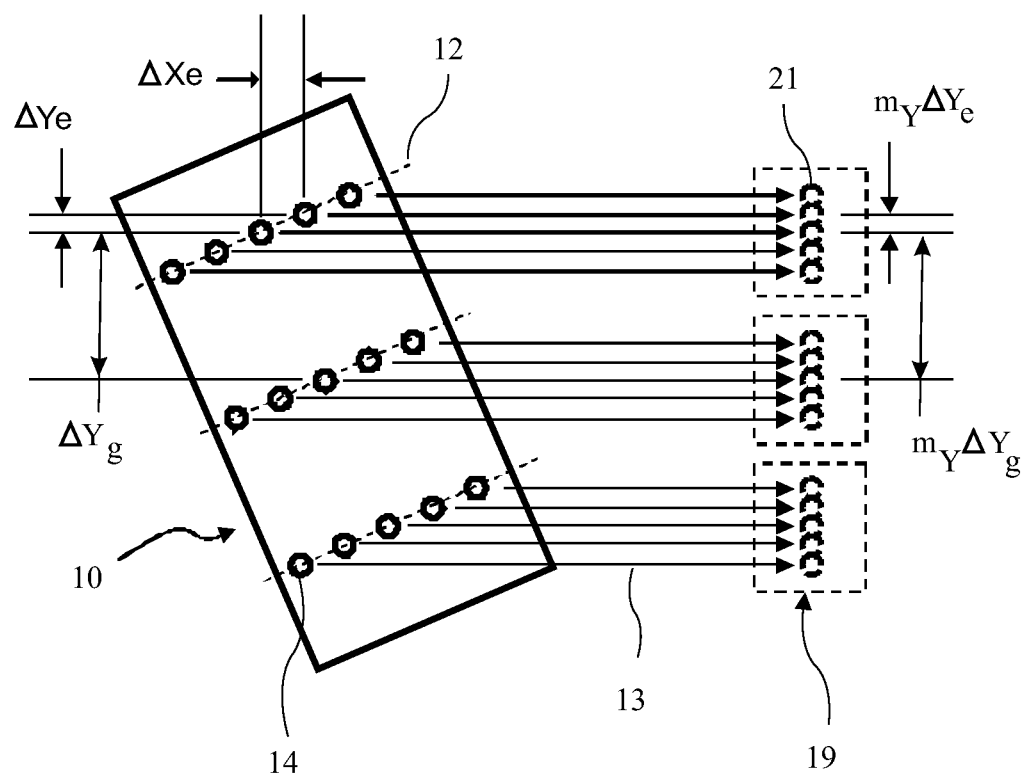
FIG. 4 is a illustrative schematic representation of one example of first dimension beam combining according to aspects of the invention.
Figure 5:
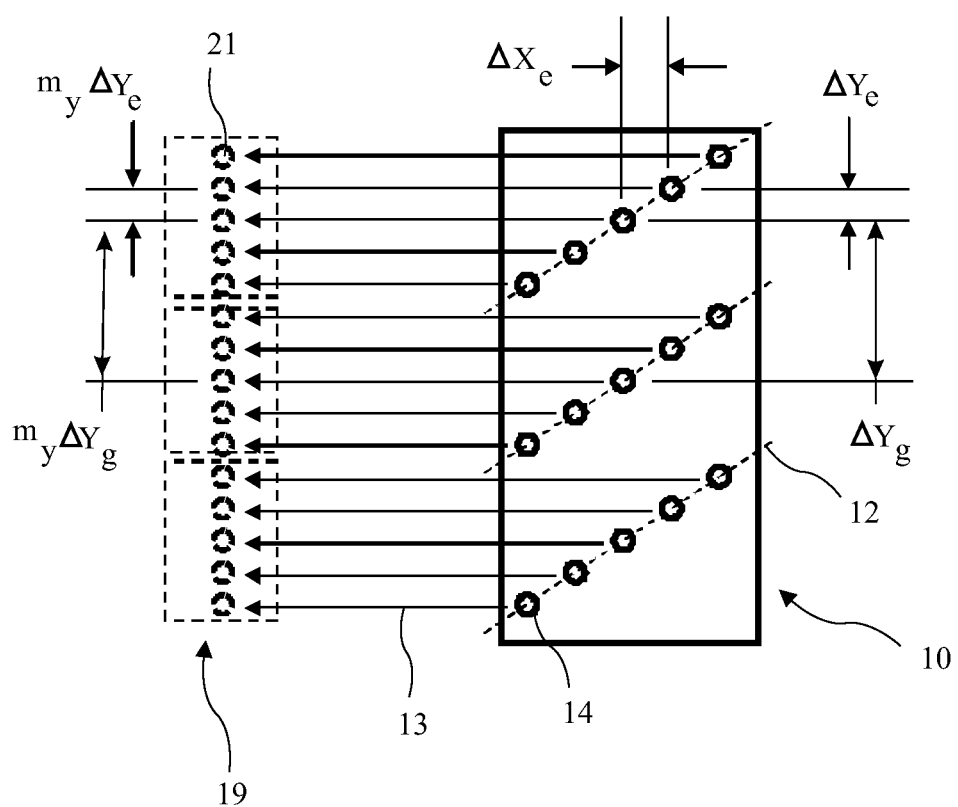
FIG. 5 is another illustrative schematic representation of one example of first dimension beam combining according to aspects of the invention.

Several aspects of the geometry of the laser emitter array 10 are shown in FIGS. 4 and 5. In order to rearrange the beams from each laser emitters 14 such that each is presented at a unique second dimension location, laser emitter rows 12 may be specified to be non-parallel (or rotated) with respect to a first dimension in order to obtain a non-zero displacement in an orthogonal second dimension, thereby producing a laser emitter spacing projected component $\Delta Y_e$ between adjacent laser emitters 14. Additionally, each group of laser emitters 14 formed by a laser emitter row 12 has nominal second dimension row spacing projected component $\Delta Y_g$ between adjacent laser emitter rows 12 as shown in FIG. 4 and FIG. 5. Furthermore, the first dimension laser emitter spacing projected component $\Delta X_e$ between adjacent laser emitters 14 is also shown in FIG. 4 and FIG. 5. An example of a method to alter the magnitude of the second dimension laser emitter spacing projected component $\Delta Y_e$ is through rotation of the laser emitter array 10 about an axis in a third dimension that is orthogonal to the first two orthogonal dimensions. First dimension beam combining is conceptualized by representative first dimension combining arrows 13. Each representative first dimension combining arrow 13 points to a corresponding beam location in the plane of a first dispersive element 18 and after having passed through the imaging optics 24 having second dimension magnification $m_Y$. The imaging optics 24 invert the image plane with respect to the object plane, a fact that can be ignored for simplicity of explanation and is not illustrated in FIG. 4 or FIG. 5. The imaging optics 24 alter the apparent size of the second dimension laser emitter spacing projected component $\Delta Y_e$ and the apparent size of the second dimension laser row spacing $\Delta Y_g$ by the magnification factor $m_Y$ resulting in a second dimension laser emitter image spacing $m_Y \Delta Y_e$ and a second dimension row image spacing $m_Y \Delta Y_g$. The collection of beam images at or near the plane of a first dispersive element 18 and originating from laser emitters 14 within a common laser emitter row 12 are described collectively as a row group 19. A first optical transform lens 16 (see FIG. 3) having optical power in a first dimension may cause each beam from each laser emitter 14 to be first dimension spatially overlapping at or near a plane of the first dispersive element 18 thereby generating a first dimension overlapped beam 21 whereby each laser emitter 14 beam has a common first dimension location.

Figure 6:
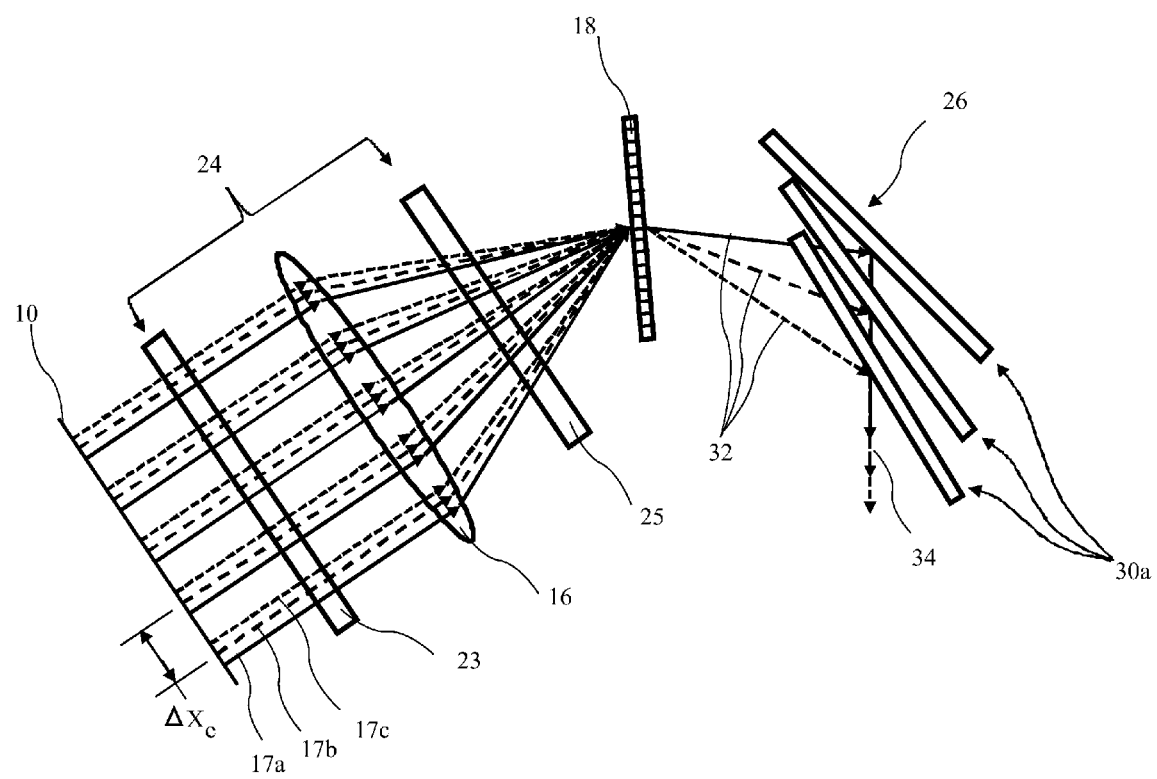
FIG. 6 is a schematic diagram of one example of a deflective array according to aspects of the invention and a schematic diagram of one example of first dimension beam combining according to aspects of the invention.

FIG. 6 shows an example of how a first optical transform lens 16 may spatially overlap laser emitter 14 beams in a first dimension at or near a first dispersive element 18 into a first dimension overlapped beam 21 similar to the beams shown in FIGS. 4 and 5. In this example, beams originating from laser emitters 14 within a common row 12 each impinge a first dispersive element 18 at a unique angle after traveling through a first optical transform lens 16. The angle difference between two adjacent beams within a common row is nominally given by the ratio of the first dimension laser emitter spacing projected component $\Delta X_e$ to the first dimension focal length of the first optical transform lens 16, namely $\Delta X_e/f_1$. The wavelength dependent angular dispersion of the first dispersive element 18 is represented by $(d\alpha_1/d\lambda)$ and when this term is multiplied by the difference in wavelength $\Delta \lambda_e$ between two adjacent laser emitters 14 within a common row 12, the product represents an angle, namely $(d\alpha_1/d\lambda)\Delta\lambda_e$. When systems are constructed whereby these two quantities are equal to each other, namely $\Delta X_e/f_1 = (d\alpha_1/d\lambda)\Delta\lambda_e$, then each beam from each laser emitter 14 within a common row 12 will emerge from the first dispersive element 18 both overlapped in a first dimension and propagating with a common angle in a first dimension as those shown in FIG. 6 as row group first dimension combined beams 32. It is to be appreciated that in this embodiment of the present invention, not all laser emitter 14 beams emerging from the first dispersive element 18 emerge at the same first dimension angle. However, all laser emitter 14 beams originating from within a common laser emitter row 12 will emerge form the first dispersive element 18 at the same angle and form row group first dimension combined beams 32 as shown. This forms the process of beam combining for laser emitter 14 beams within rows and is only a part of the process required for beam combining all beams in a first dimension according to aspects of the present invention. The process of further combining each row group first dimension combined beam 32 into an all beam first dimension combined beam 34 may be accomplished with a deflective array 26 through appropriately chosen deflections at appropriately chosen locations along the optical path, nominally one deflection for each row group first dimension combined beam 32. One example of a deflective array 26 is illustrated in FIG. 6 as an arrangement of mirrors 30, one mirror 30 for each row group first dimension combined beam 32. Since the optical field at an object plane at or near the laser emitter array 10 is imaged in a second dimension by the imaging optics 24 into a scaled copy at an image plane at or near the deflective array 26, each beam is distinguishable and not overlapping in a second dimension at or near the deflective array 26. This allows each mirror 30 of the deflective array 26 to address the beams within each row group first dimension combined beam 32 and minimizing undesired cross talk between row group first dimension combined beams 32. In other embodiments of the present invention not shown here, a deflective array 26 may reside between the second lens element 25 of the imaging optics 24 and a first dispersive element 18. Still other embodiments of the present invention not shown here, the deflective array 26 may reside at other locations between the input laser emitter array 10 and a second dimension dispersive element 22.

In addition to the first dimension beam combining discussed above, embodiments of the present invention, employ second dimension beam combining. In the example shown in FIG. 3, a second optical transform lens 20 having optical power in a second dimension causes each beam originating from each laser emitter 14 to be spatially overlapped at or near a second dimension dispersive element 22 and to impinge the second dimension dispersive element 22 at a unique angle in the second dimension. As discussed and shown above, this example includes the plurality of laser emitter 14 beams exiting the deflective array 26 as combined in a first dimension and spatially separated in a second dimension with laser emitter spacing projected component spacing $m_1\Delta Y_e$ and a plurality of row group first dimension combined beams 32 with second dimension row group spacing projected component $m_1\Delta Y_g$. As in a way similar to first dimension beam combining, second dimension beam combining holds to a pair of relationships, namely $f_2(d\alpha_2/d\lambda)=m_1\Delta Y_e/\Delta\lambda_e=m_1\Delta Y_g/\Delta\lambda_g$ whereby $(d\alpha_2/d\lambda)$ is the angular wavelength dependent dispersion of the second dispersive element 22, $f_2$ is the second dimension focal length of the second optical transform lens 20, $\Delta\lambda_e$ is the wavelength difference between two adjacent laser emitters 14 within a laser emitter row 12 and $\Delta\lambda_g$ is the wavelength difference between two adjacent row groups 19 of row group first dimension combined beams 32. When systems are constructed whereby these two pairs of relationships are maintained, namely $f_2(d\alpha_2/d\lambda)=m_1\Delta Y_e/\Delta\lambda_e=m_1\Delta Y_g/\Delta\lambda_g$, then each beam from each laser emitter 14 will emerge from a second dispersive element 22 both overlapped in both a first and second dimension and propagating with a common angle in both a first and second dimension as a multi-wavelength output beam 28, as shown in FIG. 3.

In this example, the optical elements: imaging optics 24; first optical transform lens 16; first dispersive element 18; deflective array 26; second optical transform lens 20; and second dispersive element 22, may be used in one example of a laser emitter source configuration 11a as shown in FIG. 3 and further illustrated in FIGS. 4-6, and in a manner described above, to combine a plurality of laser emitters 14 comprised of laser sources each having a unique and specified wavelength into a single combined multi-wavelength output beam 28 whereby a plurality of laser emitter 14 beams are overlapped in both dimensions and propagating in the same direction in both dimensions.

Figure 7:
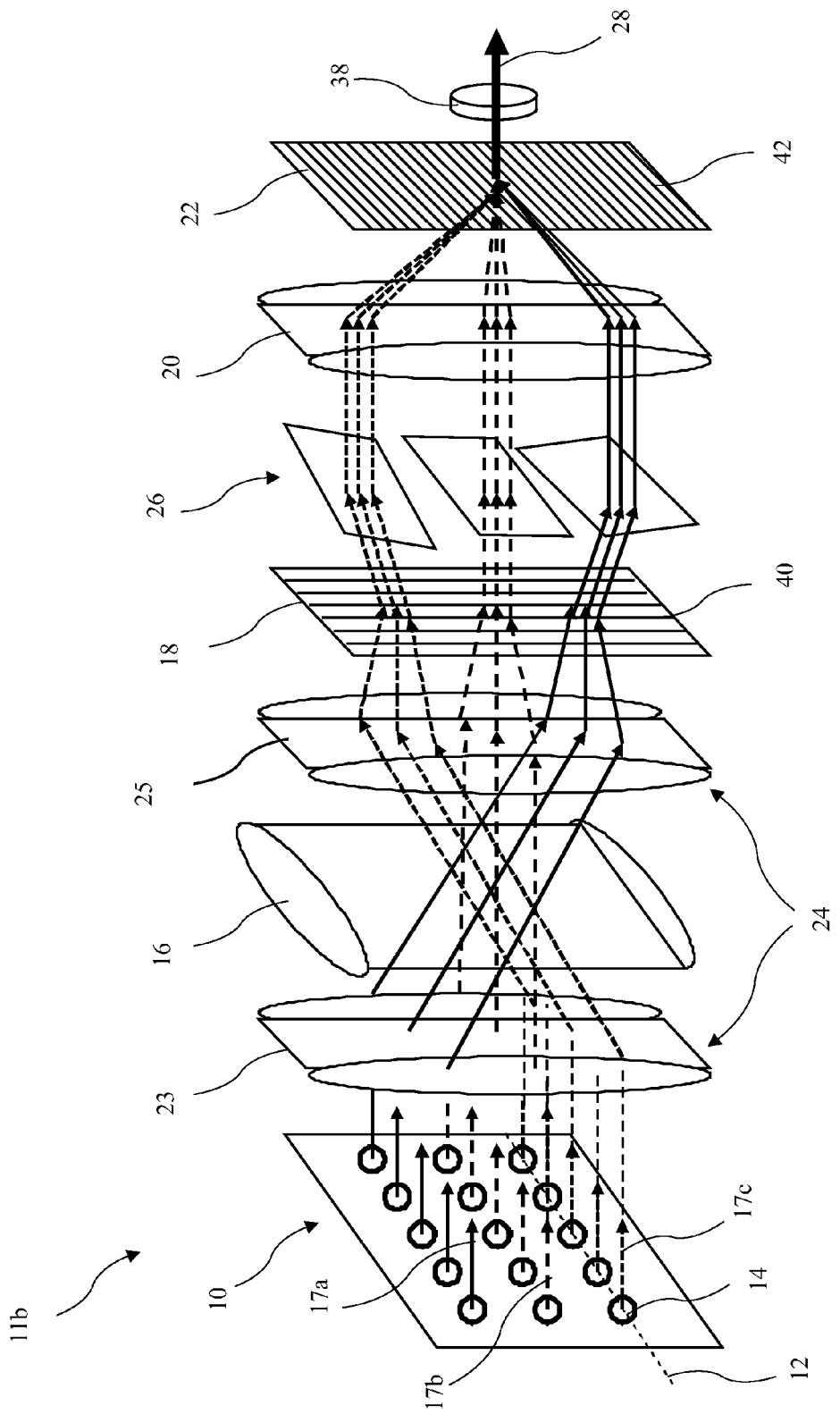
FIG. 7 is a schematic diagram of one example of two-dimensional laser system in a laser emitter gain medium configuration according to aspects of the invention.

FIG. 7 shows an embodiment of the present invention in a laser emitter gain medium configuration 11b which is similar to the laser emitter source configuration 11a shown in FIG. 3 and discussed above. A first differences between these two embodiments is that of the type laser emitter 14. In the example of a laser emitter gain medium configuration 11b the laser emitters 14 are laser gain medium, which is in contrast to the example laser emitter source configuration 11a where the laser emitters 14 are laser sources. As discussed above, each laser gain medium has optical gain at a specified wavelength and over a specified linewidth and can made to lase (amplify radiation) at a specified wavelength with external cavity optics that provide optical feedback at the specified wavelength. The optical elements: imaging optics 24; first optical transform lens 16; first dispersive element 18; deflective array 26, second optical transform lens 20, and second dispersive element 22 may be arranged, in similar manners to those disclosed above, to provided optical wavelength discrimination at specified wavelengths. An optical feedback element may be added to this arrangement whereby, collectively, they provide both the necessary optical feedback and the necessary wavelength discrimination for a laser system to operate as a plurality of external laser cavities.

In an example of the present invention in a laser emitter gain medium configuration 11b, an optical feedback element in the form of an output coupler 38 having partial reflectivity at a plurality of wavelengths over the wavelength range of the laser emitters 14 is placed along the multi-wavelength beam 27 path emerging from the second dispersive element 22 to return a fraction of the multi-wavelength beam 27 emerging from the second dispersive element 22 toward the plurality laser emitters 14, as shown in the example illustrated in FIG. 6. In this embodiment, each laser emitter 14 can be made to automatically stabilize its wavelength and lase (amplify radiation) as an independent eternal cavity operating at a unique center wavelength and over a unique range of wavelengths determined by the circulating feedback wavelength dependent gain of the external cavity. In this embodiment of the present invention, a multi-wavelength output beam 28 emerges from the output coupler 38 whereby a plurality of laser emitter 14 beams produced by a plurality of external cavities are overlapped in both dimensions and propagating in the same direction in both dimensions.

In other embodiments of the present invention, the output coupler 38 may be positioned at other locations along the path of the multi-wavelength beam 27 to provide optical feedback to the plurality of laser emitters 14. For example, locations whereby a plurality of laser emitter 14 beams are propagating at angles that are parallel to one another, are locations whereby a flat surface can be positioned normal to the optical axis of the laser emitter 14 beams and can provide wavelength discriminating optical feedback from an output coupler 38 having a flat surface and placed there. Additionally, in another example, locations whereby a plurality of laser emitter 14 beams are propagating toward a point, are locations whereby a surface having spherical curvature can be specified and positioned so that a plurality of laser emitter 14 beams are propagating at angles that are normal to the surface, and can provide wavelength discriminating optical feedback from an output coupler 38 having the specified spherical curvature and positioned there.

For example, according this invention placing the output coupler 38 at a location after the deflective array 26 and the first dispersive element 18 and before the second optical transform lens 20 can be made to provide optical feedback at the specified wavelengths to generate optical gain for the plurality of laser emitters 14 from the laser emitter array 10 and cause a multi-wavelength output beam 28 to emerge from the second dispersive element 22 in a laser emitter gain medium configuration 11b. In another example, separate output couplers 38 may be placed at different angles and along each multi-wavelength row beam 29 path and between the first dispersive element 18 and the deflective array 26 to provide the wavelength discriminating optical feedback for a plurality of laser emitters 14 within a laser emitter row 12 as well as the plurality of laser emitters 14 within the laser emitter array 10.

Thus, there has been described at least two embodiments of two-dimensional wavelength beam combining of two-dimensional laser emitter arrays 10 according to aspects of the intention. The invention may be used as a technique to enhance the power and/or brightness of a two-dimensional array of laser emitters 14.

Any of the above discussed embodiments of a wavelength beam combining system may be incorporated into an associated laser system. Such a laser system may include, for example, a wavelength beam combining system, electrical, thermal, mechanical, electro-optical and opto-mechanical laser control equipment, associated software and/or firmware, and an optical power delivery subsystem. Embodiments of the wavelength beam combining laser system, and associated laser systems, can be used in applications that benefit from the high power and brightness of the embodied laser source produced using the wavelength beam combining system. These applications may include, for example, materials processing, such as welding, drilling, cutting, annealing and brazing; marking; laser pumping; medical applications; and directed energy applications. In many of these applications, the laser source formed by the wavelength beam combining system may be incorporated into a machine tool and/or robot to facilitate performance of the laser application.

While the invention herein disclosed has been described by means of specific embodiments and applications thereof, numerous modifications and variations could be made thereto by those skilled in the art without departing from the scope of the invention set forth in the claims.

I claim:

1. A multi-wavelength laser device comprising:
   a plurality of laser emitters (14), wherein each laser emitter (14) produces optical radiation having a different wavelength;
   a laser emitter array (10) comprising the plurality of laser emitters (14) wherein the plurality of laser emitters (14) are arranged in a two-dimensional pattern;
   a multi-wavelength beam (27) comprising a plurality of multi-wavelength row beams (29), each of the multi-wavelength row beams (29) emanating from the plurality of laser emitters (14) within a laser emitter row (12);
   an imaging optics (24) positioned after the laser emitter array (10) and receiving the multi-wavelength beam (27) to generate imaged beams;
   a first optical transform lens (16) positioned about one focal length from the laser emitter array (10) and receiving the multi-wavelength beam (27) and spatially overlapping the multi-wavelength beam (27) in a first dimension;
   a first dispersive element (18) having a wavelength dependent dispersion in the first dimension and following the first optical transform lens (16) and receiving the spatially overlapped beams and generating parallel beams in the first dimension;
   a deflective array (26) following the first dispersive element (18), wherein the imaging optics (24) are configured to reimage in at least one dimension a scaled image of the optical field near the laser emitter array (10) to a location near the deflective array (26), the deflective array (26) receiving the parallel beams and generating deflected beams in a first dimension;
   a second optical transform lens (20) positioned approximately a focal length from the first dispersive element (18) and configured to receive the multi-wavelength beam (27) and to spatially overlap the optical beams in a second dimension forming a second region of overlap at the second dispersive element (22), the second optical transform lens (20) receiving the deflected beams and generating transformed beams; and
   a second dispersive element (22) following the second optical transform lens 28 (20) and having wavelength dependent dispersion in a second dimension and configured to receive the transformed beams and transmit a multi-wavelength output beam (28) comprising the a plurality of spatially overlapped optical beams; and
   the first and second dimensions are orthogonal such that the deflective array (26) generates deflected beams by deflecting the beams in a plane orthogonal to a plane of dispersion of the second dispersive element (22).

2. The multi-wavelength laser of claim 1, further including a first optical transform lens (16) positioned approximately a focal length from the laser emitter array (10) and configured to receive the multi-wavelength beam (27) and to spatially overlap the optical beams in a first dimension forming a first region of overlap at the first dispersive element (18).

3. The multi-wavelength laser as claimed in claim 1, wherein the first dispersive element (18) is a first-order diffraction grating.

4. The multi-wavelength laser as claimed in claim 1, wherein the first dispersive element (18) is a prism.

5. The multi-wavelength laser as claimed in claim 1, wherein the second dispersive element (22) is a first-order diffraction grating.

6. The multi-wavelength laser as claimed in claim 1, wherein the second dispersive element (22) is a prism.

7. The multi-wavelength laser as claimed in claim 1, wherein the first optical transform lens (16) comprises a plurality of lens elements having focus power in at least one dimension.

8. The multi-wavelength laser as claimed in claim 1, wherein the first optical transform lens (16) comprises a plurality of mirror elements having focus power in at least one dimension.

9. The multi-wavelength laser as claimed in claim 1, wherein the second optical transform lens (20) comprises a plurality of lens elements having focus power in at least one dimension.

10. The multi-wavelength laser as claimed in claim 1, wherein the second optical transform lens (20) comprises a plurality of mirror elements having focus power in at least one dimension.

11. The multi-wavelength laser as claimed in claim 1, wherein the imaging optics (24) comprises a plurality of lens elements having focus power in at least one dimension.

12. The multi-wavelength laser as claimed in claim 1, wherein the imaging optics (24) comprises a plurality of mirror elements having focus power in at least one dimension.

13. The multi-wavelength laser as claimed in claim 1, wherein:
   the deflective array (26) comprises a plurality of deflective elements (31); and
   at least one deflective element (31) element is a mirror.

14. The multi-wavelength laser as claimed in claim 1, wherein:
   the deflective array (26) comprises a plurality of deflective elements (31); and
   at least one deflective element (31) is an optical wedge.

15. The multi-wavelength laser as claimed in claim 1, wherein:
   the laser emitter array (10) comprises a plurality of laser emitters (14) arranged in a first number of rows R; and
   the deflective array (26) comprises at least R−1 deflective elements (31).

16. The multi-wavelength laser as claimed in claim 1, wherein:
   the deflective array (26) comprises at least two deflective elements (31); and
   at least two deflective elements (31) are arranged to each deflect at least one multi-wavelength row beam (29).

17. The multi-wavelength laser as claimed in claim 1, wherein:
   the plurality of laser emitters (10) is a plurality of laser gain medium; and
   further comprising a partially reflecting output coupler (38) configured to receive the multi-wavelength beam (27) at a location after both the deflective array (26) and the first dispersive element (18) and to reflect a portion of the multi-wavelength beam (27) and to transmit a remaining portion of the multi-wavelength beam (27).

18. The multi-wavelength laser as claimed in claim 1, wherein the plurality of laser emitters (14) is a plurality of fiber lasers.

19. The multi-wavelength laser as claimed in claim 1, wherein the plurality of laser emitters (14) is a plurality of semiconductor diode lasers.

20. A method of two-dimensional wavelength beam combining in a laser system, the method comprising:

generating a multi-wavelength beam (27) using an emitter array (10);

bending individual wavelength beams within row beams of the multi-wavelength beam (27) to be mutually parallel and overlapping in a first dimension using a first dispersive element (18);

deflecting the mutually parallel and overlapping in the first dimension beams to be mutually parallel and overlapping in the first dimension using a deflective array (26), bending the mutually parallel and overlapping in the first dimension beams in a second dimension in a second dispersive element (22) to generate a multi-wavelength output beam (28), wherein the first and second dimensions are orthogonal such that deflecting the mutually parallel and overlapping in the first dimension beams occurs in a plane orthogonal to a plane of dispersion of the second dispersive element (22).

21. The method as claimed in claim 20, further comprising imaging a scaled image of the optical field near the laser emitter array (10) using imaging optics (24) in at least one dimension to a location near the deflective array (26).

22. The method as claimed in claim 20, further including bending the individual wavelength beams of the multi-wavelength beam (27) in a first optical transform lens (16) to overlap the individual wavelength beams of the multi-wavelength beam (27) in the first dimension at the first dispersive element (18).

23. The method as claimed in claim 22, further comprising imaging a scaled image of the optical field near the laser emitter array (10) using imaging optics (24) in at least one dimension to a location near the deflective array (26).

24. The method as claimed in claim 22, further including bending the individual wavelength beams of the multi-wavelength beam (27) in a second optical transform lens (20) to overlap the individual wavelength beams of the multi-wavelength beam (27) in the second dimension at the first dispersive element (22).

25. The method as claimed in claim 24, further comprising imaging a scaled image of the optical field near the laser emitter array (10) using imaging optics (24) in at least one dimension to a location near the deflective array (26).

26. The method as claimed in claim 20, further including bending the individual wavelength beams of the multi-wavelength beam (27) in a second optical transform lens (20) to overlap the individual wavelength beams of the multi-wavelength beam (27) in the second dimension at the first dispersive element (22).

27. The method as claimed in claim 26, further comprising imaging a scaled image of the optical field near the laser emitter array (10) using imaging optics (24) in at least one dimension to a location near the deflective array (26).

28. A method of two-dimensional wavelength beam combining in a laser system, the method comprising:

generating a multi-wavelength beam (27) using an emitter array (10);

bending individual wavelength beams within row beams of the multi-wavelength beam (27) to be mutually parallel and overlapping in a first dimension using a first dispersive element (18);

bending the mutually parallel and overlapping in the first dimension beams in a second dimension in a second dispersive element (22) to generate a multi-wavelength output beam (28), wherein the first and second dimensions are orthogonal; and deflecting all of the beams in a first dimension such that deflecting occurs in a plane orthogonal to a plane of dispersion of the second dispersive element within each row of the multi-wavelength beam (27) in the first dimension to make all of the individual beams forming the multi-wavelength output beam (28) to be parallel and overlapping using a deflective array (26).

* * * * *